June 2, 1959 M. W. GREEN 2,889,469

SEMI-CONDUCTOR ELECTRICAL PULSE COUNTING MEANS

Filed Oct. 5, 1955

2 Sheets-Sheet 1

INVENTOR.

Milton W. Green

BY

ATTORNEY.

SEMI-CONDUCTOR ELECTRICAL PULSE COUNTING MEANS

Filed Oct. 5, 1955

INVENTOR.
Milton W. Green
BY H. L. Newton
ATTORNEY.

United States Patent Office 2,889,469

Patented June 2, 1959

2,889,469

SEMI-CONDUCTOR ELECTRICAL PULSE COUNTING MEANS

Milton W. Green, Princeton, N.J., assignor to Radio Corporation of America, a corporation of Delaware Application October 5, 1955, Serial No. 538,623

11 Claims. (Cl. 307—88.5)

Figure 1:
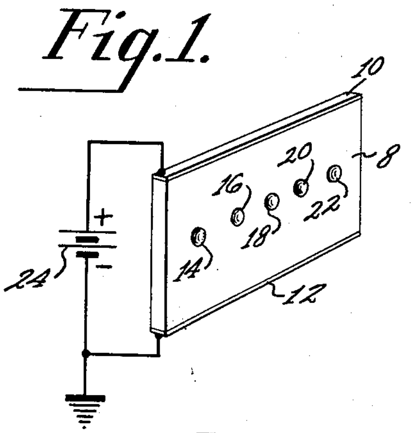

This invention relates to semi-conductor electrical pulse counting means, and in particular to pulse counter and frequency divider circuits and multielectrode semi-conductor devices for use therewith.

Circuits for counting the repetition of electrical pulses and frequency divider circuits may, for example, be useful in electronic computer or pulse code modulation systems, and as time-base or television synchronous generators. In general, such circuits may include a plurality of interconnected components or stages, each stage including at least one active element such as a vacuum tube, gas tube or semi-conductor device. Conventional counters, therefore, whether employing tubes or semi-conductor devices, such as transistors, may be subject to the disadvantage that a plurality of tubes or transistors as the case may be, as well as considerable interconnecting circuitry, are required. In tube counter circuits in particular, relatively large amounts of heater power may be required for operation. In addition, the space requirements for such circuits may be large and because of the large number of component parts required, circuit failures may be relatively great.

It is, accordingly, an object of the present invention to provide improved electrical pulse counting means which may comprise a single multielectrode semi-conductor device.

It is another object of the present invention to provide an improved electrical impulse counting and frequency dividing circuit having a single semi-conductor device, which is highly stable and reliable in operation.

It is yet another object of the present invention to provide improved frequency dividing and counter circuits that require a single multielectrode semi-conductor device for high speed counting and frequency dividing operation with minimum power requirements.

These and further objects of the present invention are achieved by the utilization of a semi-conductor device which includes a semi-conductive body having a pair of end or base electrodes and a plurality of emitter electrodes. Each of the emitters or emitter electrodes of such a device has two stable states of operation, one a non-conducting condition and the other a condition of high current conduction. Each of the emitters may be switched from one stable condition to the other and coupling between the emitters is accomplished by the field distribution within the semi-conductive body. By associating circuitry with the semi-conductor device of the type which will propagate the conducting condition along the semi-conductive body, a frequency divider or counter may be constructed which requires the use of but one semi-conductor device.

Figure 2:
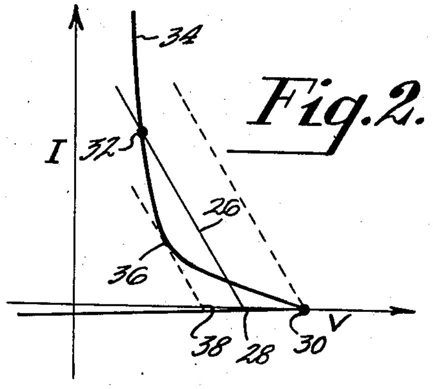
Figure 3:
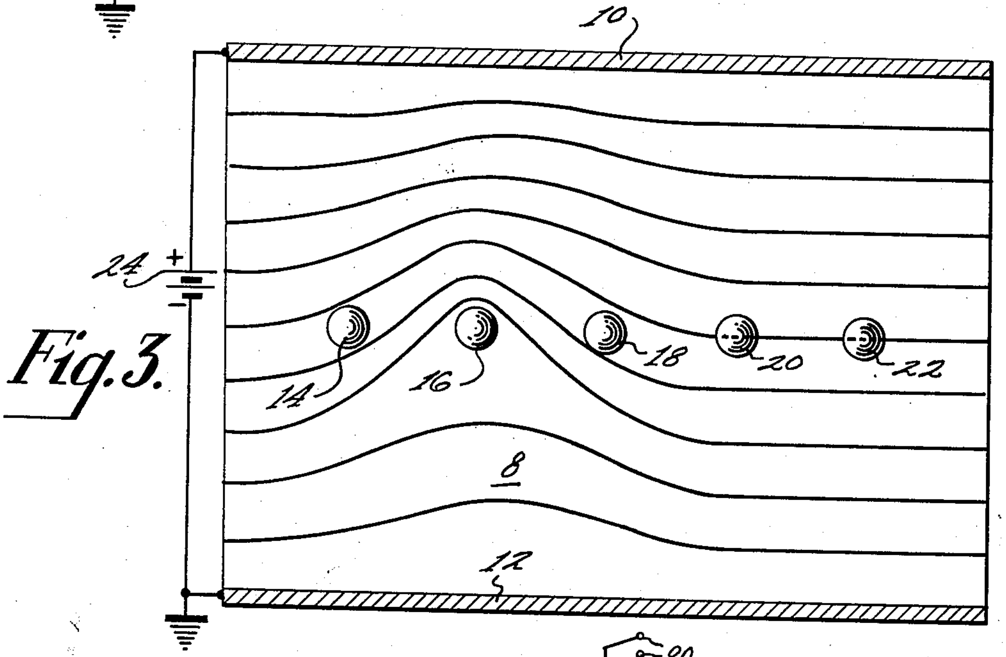

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a view in perspective of a semi-conductor device embodying the invention, Figure 2 is a graph illustrating the operating characteristics, in accordance with the invention, of a device of the type illustrated in Figure 1, Figure 3 is an elevational view of a semi-conductor device of the type illustrated in Figure 1 and illustrating the potential distribution across the device.

Figure 4:
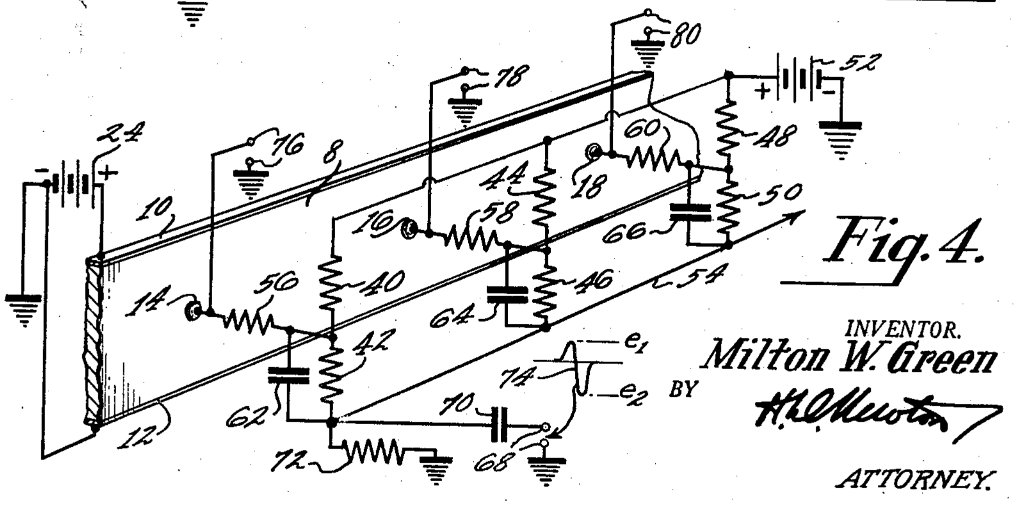
Figure 5:
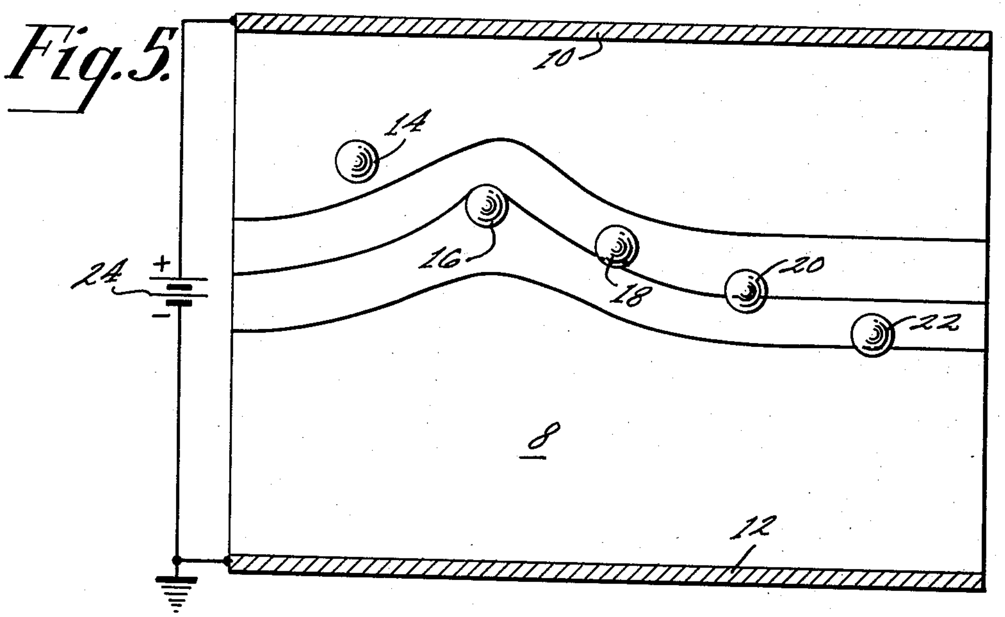
Figure 6:
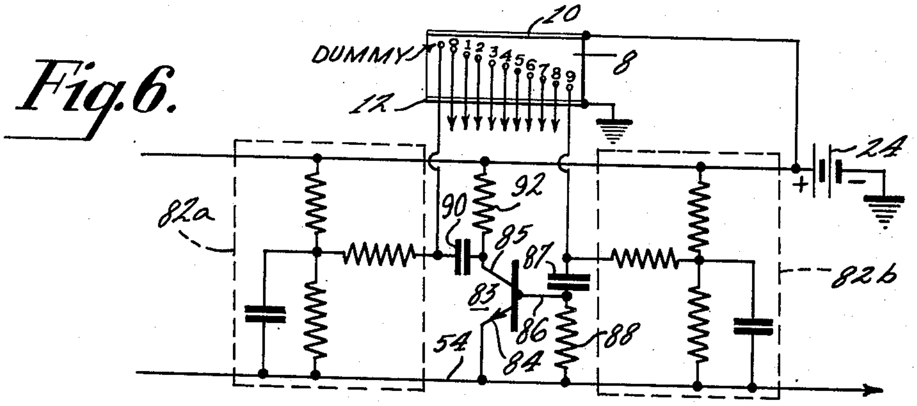
Figure 7:
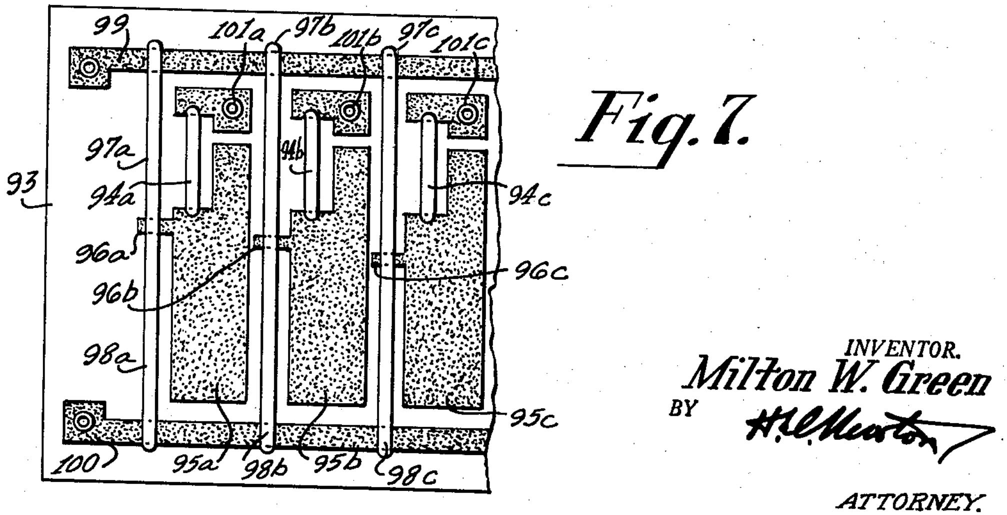

Figure 4 is a schematic circuit diagram of a pulse counter circuit utilizing a semi-conductor device of the type illustrated in Figure 1 and embodying the invention, Figure 5 is an elevational view of a further semi-conductor device of the type adapted for use in a circuit embodying the invention, illustrating the potential distribution across the device, Figure 6 is a schematic circuit diagram of a frequency divider or counter circuit embodying the invention, and Figure 7 is a plan view of a printed circuit structure suitable for use with semi-conductor devices of the type described, in accordance with the invention.

Referring now to the drawing, wherein like parts are indicated by like reference numerals throughout the figures, and referring particularly to Figure 1, a semi-conductor device embodying the invention includes a body or wafer 8 of semi-conductive material, such as, for example, germanium or silicon and which will be assumed, for purposes of explanation, to be of N type conductivity. The ends or faces along the length of the semi-conductive body 8 are terminated in two electrodes 10 and 12 which are in ohmic contact with the body 8 and may be referred to as the first base electrode 10 and the second base electrode 12. It should be noted that the width of the semi-conductive body 8 is substantially less than its length, that is the distance between the base electrodes 10 and 12 is less than the distance between the other ends of the semi-conductor body 8. The semi-conductor device further includes a plurality of rectifying junction electrodes or emitters 14, 16, 18, 20 and 22 arranged in a row along the length of the semi-conductor body 8. These emitter electrodes may be fused indium dots, by way of example. While five of such electrodes have been illustrated, the number chosen may be variable depending on the particular application for the device. The emitter electrodes will further be assumed, for purposes of explanation, to be of P type conductivity.

To supply operating biasing potentials to the semi-conductor device, a source of direct current potential such as illustrated by a battery 24 has its negative terminal connected to a point of reference potential or ground for the system, and its positive terminal connected to the upper or first base electrode 10. The lower or second base electrode 12 is grounded as shown.

Referring now to Figure 2, the current (I) flowing into one emitter electrode of a semi-conductor device of the type illustrated in Figure 1 has been plotted against variations in the voltage (V) which is applied between the same emitter and ground. The solid line 26 represents, in this graph, a load line which intersects the abscissa at the point 28, which point represents an applied voltage of some value at which the semi-conductor device is in the off or non-conducting condition. By momentarily increasing the voltage which is applied between the emitter and ground, however, to the point 30, the semi-conductor device is switched to the on or conducting region as illustrated by the point 32 on the curve 34. When the applied voltage is momentarily increased, the semi-conductor devices switch from an off condition, through a negative resistance or transition region 36 to the region of high current conduction or saturation region. By momentarily decreasing the applied voltage to the point 38, on the other hand, the semi-conductor device is switched to an off or non-conducting condition. Thus each of the emitters of a semi-conductor device of the type illustrated in Figure 1 has two distinct stable states in which it is either off or on or, in other words, in a non-conducting or highly conductive condition.

Referring now to Figure 3, an enlarged side view of a semi-conductor device of the type illustrated in Figure 1 is depicted for the purpose of illustrating the approximate field or potential distribution across the semi-conductive body 8. For purposes of explanation, it will be assumed that the battery 24 has a voltage rating of 10 volts so that the first base 10 is 10 volts positive with respect to the second base 12. It will further be assumed that each of the emitters are located on a line along the length of the semi-conductor body 8 half way between the ohmic connections 10 and 12. It will also be assumed that the emitter 16 is in the on or conducting condition. This condition could be obtained, for example, by connecting the emitter 16 through a series resistor to a positive source of direct current potential. The emitter 16 is thus in the stable condition of high current conduction as illustrated by the point 32 in the graph illustrated in Figure 2 and will be conducting at a potential (V) of approximately 2.5 volts, assuming that the battery voltage is 10 volts. With the emitter 16 in the stable condition of high current conduction, the two emitters 14 and 18 immediately adjacent the emitter 16 will "see" a potential (V) of approximately 4.5 volts, again assuming a battery voltage of 10 volts. The remaining emitters, that is the emitters 20 and 22 will, on the other hand, "see" a potential (V) of approximately 5.0 volts.

By virtue of the aforementioned characteristics of a semi-conductor device embodying the invention, an aperiodic pulse counter may be constructed using a single device of the type described. This is illustrated in Figure 4, reference to which is now made. The semi-conductive body 8 of a semi-conductor device of the type illustrated in Figures 1 and 3 has been broken away at one end for simplifying the explanation of the operation of the counter. Accordingly, while only three emitters 14, 16 and 18 are illustrated, it should be understood that this number is by way of example only and that the number of emitters used would depend on the particular application, there being no real limitation to the number used. As in Figures 1 and 3, the battery 24 is connected between the base electrodes 10 and 12, the second base 12 being grounded. Associated with each of the emitters 14, 16 and 18 are identical voltage dividers comprising resistors 40 and 42, 44 and 46, and 48 and 50. Each of the resistors 40, 44 and 48 is connected to the positive terminal of a second battery 52, which could be the battery 24 if desired and which will be assumed to be a 10 volt battery. Each of the other resistors of the respective voltage dividers, namely the resistors 42, 46 and 50 are returned to a common bus 54. The junction point of the resistors of each of the voltage dividers is connected through resistors 56, 58 and 60 to the emitters 14, 16 and 18 respectively. Respective capacitors 62, 64 and 66 are also connected from each of these junction points to the common bus 54.

To apply input pulses to the counter, a pair of input terminals 68 are provided, one of which is grounded and the other of which is coupled through a coupling capacitor 70 to the common bus 54. A resistor 72 is connected from the bus 54 to system ground as shown. The resistance of the resistor 72 is chosen to be smaller than the resistance of the remaining resistors in the circuit so that the direct current flowing through it from the voltage dividers will not appreciably affect the voltage at the emitter electrodes. In a typical example, the resistance of the resistor 72 may be 1000 ohms, for example.

In operation, assuming battery voltages of 10 volts for the batteries 24 and 52 and for example, that the resistors 40, 44 and 48 are each 60,000 ohms and the resistors 42, 46 and 50 are each 40,000 ohms, the emitters 14, 16 and 18 will all be in the off condition and each of the capacitors 62, 64 and 66 will be charged to a positive potential of 4 volts. At the same time each of the emitters 14, 16 and 18, assuming they are each half way between the ohmic connections 10 and 12 will see a voltage of 5 volts on the semi-conductive body 8. Thus the effective bias voltage on each of the emitters is 1 volt negative, which is a bias in the reverse or non-conducting direction. Hence there will initially be no current flowing in any of the emitters 14, 16 and 18.

With a condition of no current flowing in the emitters of the semi-conductor device, assume that a short positive voltage pulse is applied to the circuit at the terminals 76, one of which is grounded and the other of which is connected with the emitter 14. This pulse will be applied to the emitter 14. The emitter 14 will, accordingly, instantly begin to conduct current and will be in the on condition, corresponding, for example, to the point 32 in Figure 2. It is assumed, for purposes of explanation, that the resistance of the resistors 40, 42 and 56 is chosen so that the effective load line is as shown by the line 26 in Figure 2. For these purposes the resistance of the resistor 56 will be chosen to be relatively small, for example 1000 ohms. With the emitter 14 in the highly conductive or on condition, it will assume a potential of approximately 2.5 volts in accordance with the foregoing description of Figures 2 and 3. If the resistance of the resistor 56 is further assumed to be relatively small, the capacitor 62 will rapidly assume a charge substantially equal to the potential on the emitter 14, that is, 2.5 volts positive. At the same time, the next emitter 16 in the row will now "see" a potential of 4.5 volts rather than 5.0 volts, while the remaining emitter 18 will continue to see a potential of 5.0 volts. The semi-conductor device and its associated circuitry is now in a condition representing a count of one.

It will next be assumed that a small positive pulse, equal to a voltage of $e_1$ as shown by the input waveform 74, is applied to the input terminals 68 and through the coupling capacitor 70 to the common advance bus 54. In a typical example the voltage $e_1$ will be somewhat larger than 0.5 volts but smaller than 1.0 volts. This small positive pulse will be sufficient to drive the emitter 16 into conduction but will not be sufficient, since the emitter 18 previously "saw" a voltage of 5 volts, to drive the emitter 18 into conduction. The first two emitters, namely the emitters 14 and 16, are now in the on or conductive condition. A negative pulse equal to a voltage of $e_2$, as shown by the input waveform 74, is applied to the advance bus 54 immediately following the application of the positive pulse. It will be assumed that the capacitor 62 is large enough to maintain a substantially constant voltage of 2.5 volts for the duration of the pulse and that the voltage of this pulse is 1 volt negative. The emitter 14 will then momentarily be at a potential of 1.5 volts positive, which potential is insufficient to maintain the emitter 16 in a conductive condition. Accordingly, the emitter 14 will switch to an off or non-conducting condition as illustrated by the point 38 in the graph of Figure 2. The charge on the capacitor 64, which is associated with the emitter 16, will still be sufficiently positive to maintain current conduction of the emitter 16. The remaining emitter 18 will be unaffected by either the applied positive or negative pulse. Accordingly, the emitter 16 will be conductive and the remaining emitters 14 and 18 will be non-conductive at this point in the circuit operation.

Following the application of the first negative-positive pulse pair as indicated by the waveform 74, a short period of time (in the order of a few microseconds) is allowed to elapse so that the capacitor 64 is allowed to lose some of its charge. The application of the next positive-negative pulse pair will cause the emitters 18 and 14 to be in the on or conductive condition, while the remaining emitter 16 will be in the off or non-conducting condition. Depending on the number of emitters used, therefore, an aperiodic pulse counter may be constructed, in accordance with the invention, while is capable of counting up to any number desired. Output pulses may be derived from each of the emitters from respective pairs of output terminals 76, 78 and 80, one terminal of each pair being grounded and the other being connected directly with the emitters 14, 16 and 18 respectively.

While providing counter operation with a circuit utilizing but one semi-conductor device and its associated circuitry, the counter circuit illustrated in Figure 4 would not be ideally suited as an aperiodic shift register or scaler in that there is nothing to prevent the propagation of the on condition in the backward as well as the forward direction. While extra circuit elements, such as diodes, might be added to prevent this backward propagation, it is possible to achieve the same result for shift register or scaler applications without the addition of relatively costly and space-consuming circuit elements. This is illustrated in Figure 5, reference to which is now made.

The semi-conductor device illustrated in Figure 5 includes the semi-conductive body 8, the base electrodes 10 and 12 and a plurality of emitters 14, 16, 18, 20 and 22 as in Figures 1 and 3. The emitters 14, 16, 18, 20 and 22, however, are located on the germanium body 8 in a descending row along the length of the semi-conductor body 8 as viewed in the drawing from left to right. A partial potential distribution across the semi-conductive body 8 for this type of an arrangement is also shown. The second emitter 16 is assumed to be in the on or conducting condition, while the remaining emitters 14, 18, 20 and 22 are in the off or non-conducting condition.

By arranging the emitters as described, each of the emitters "sees" a slightly lower potential than the previous one. Voltage dividers of the type illustrated in Figure 4 can then be associated with each of these emitters. Rather than providing equal potentials as shown in Figure 4, however, the voltage dividers would be adjusted and selected so as to provide a series of descending biasing potentials for each of the emitters. By proper selection of the voltage dividers each emitter would be biased to be 1 volt below conduction, for example. It will be seen, therefore, that upon the application of a positive-negative pulse pair to a device of the type illustrated in Figure 5 with circuit connections similar to the circuit connections illustrated in Figure 4, only the emitter to the immediate right of the previously conducting emitter will be driven to conduction. Accordingly, only one emitter will be in the on or conducting condition at any given time. The on condition will then propagate only to the right as viewed in the drawing upon the application of succeeding positive-negative pulse pairs. Accordingly, by arranging the emitters on the semi-conductor device in descending rows as illustrated in Figure 5 and connecting the device in a circuit of the type illustrated in Figure 4 with voltage dividers selected to apply descending potentials to the emitters, a circuit capable of providing shift register or scale operation is possible. As in the previous figures, moreover, only one semi-conductor device is needed.

In Figure 6, reference to which is now made, an aperiodic shift register or scaler includes a semi-conductor device of the type illustrated in Figure 5 but which has, in addition to two base electrodes 10 and 12, eleven emitter electrodes which are indicated by the legend "dummy" and the numerals 0 to 9 inclusive. These emitters are arranged in descending order from left to right as viewed in the drawing and in accordance with the foregoing description of Figure 5. While not shown for purposes of simplification, a voltage dividing network would normally be associated with each of the emitters of the same type shown in Figure 4 and arranged to provide a series of descending potentials to the emitters as viewed from left to right in the drawing and as described in connection with Figure 5. Two of such voltage dividing networks have been illustrated and are indicated by the reference numerals 82*a* and 82*b*. The voltage dividing network 82*a* is connected to the dummy emitter while the network 82*b* is connected to the last emitter which is indicated by the legend 9. The remaining nine voltage dividing networks would be substantially identical with these two networks and one would be associated with each of the remaining emitter electrodes.

The circuit arrangement illustrated in Figure 6 is such that following current conduction of the last emitter, that is, the emitter legended 9, the circuit is automatically reset. This is accomplished, in accordance with this feature of the invention, by provision of the extra or dummy emitter and a transistor 83 which is connected in circuit between the last emitter, legended 9, and the dummy emitter. The transistor 83 may be considered to be of the N–P–N junction type. Thus its conductivity is opposite to that of the conductivity of the semi-conductive body 8. If the semi-conductive body 8 were of P type conductivity, then the transistor 83 would be chosen to be of N type conductivity.

The transistor 83 includes an emitter 84 which is connected with the common bus 54. The base 86 of the transistor 83 is coupled through a coupling capacitor 87 to the emitter 9 and through a resistor 88 to the common bus 54. The collector 87 of the transistor 83 is coupled through a coupling capacitor 90 to the dummy emitter. The collector 87 is also connected through a resistor 92 to the positive terminal of the battery 24, the negative terminal of which is grounded as shown. In Figure 6, the battery 24 is arranged to apply a biasing potential to the emitter electrodes of the semi-conductor device as well as between the base electrodes 10 and 12.

In operation, the circuit illustrated in Figure 6 operates similarly to the circuit illustrated in Figure 5. Accordingly, the application of positive-negative pulse pairs to the circuit will cause each emitter to conduct in turn from left to right as the count progresses in this direction. By locating the emitters in a descending row along the length of the semi-conductor body 8 and arranging the voltage dividing networks so that descending potentials are applied to each emitter propagation of the conducting condition in a backward direction, that is, from right to left is prevented. A scale of 10 counter is thus provided, utilizing a single semi-conductor device.

When the final emitter, legended 9 in the drawing, begins to conduct, it will drop in potential, as shown for example by the point 32 in the graph illustrated in Figure 2. This drop in potential is applied between the base 86 and the emitter 84 of the transistor 83, which is connected as an amplifier. The output circuit of the transistor 83 is coupled to the first or dummy emitter of the semi-conductor device. Thus when the last emitter begins to conduct, a positive pulse appears at the collector 85 of the transistor 83 which is impressed upon the first or dummy emitter causing it to conduct. By connecting the transistor 83 in circuit between the last emitter and the dummy emitter, therefore, means are provided for automatically resetting the counter circuit. Upon application of the next positive-negative pulse pair the dummy emitter and the final emitter are rendered non-conductive and the first emitter, legended 0, is rendered conductive.

In Figure 7, a printed circuit board with which a semi-conductor device of the type described could be associated to provide an extremely compact circuit structure capable of providing frequency dividing and counting is illustrated. The board includes a ceramic sheet 93 of dielectric material, such as, for example, barium titanate, upon which the circuit elements comprising voltage dividing networks such as the networks 82a and 82b in Figure 6 are printed. The areas indicated by the reference numerals 94a, 94b and 94c are strips of resistive paint which correspond, for example, to the resistors 56, 58 and 60, respectively, in Figure 4. The areas 95a, 95b and 95c correspond, on the other hand, to the capacitors 62, 64 and 66 respectively in Figure 4. The reverse side of the dielectric sheet 93 would be silvered in a position corresponding to these areas to form the metallized second plates of the respective capacitors.

Connecting tabs 96a, 96b and 96c are also provided and are connected from the printed capacitors 94a, 94b and 94c respectively to vertical strips of resistive paint. Each of these strips is thus divided into two separate strips such as the strips 97a, 97b and 97c and 98a, 98b and 98c to form voltage dividers which correspond to the voltage dividers which include the resistors 40, 44 and 48 and 42, 46 and 50 respectively in Figure 4. The taps 96a, 96b and 96c are tapped on the resistive strips at successively lower points to provide descending potentials for the emitter electrodes with which they are associated as explained in connection with Figure 5. A power supply bus for the circuit panel is provided by a conductive strip 99 which is printed on the panel 93 and contacts the upper ends of each of the voltage dividing resistive strips. A common advance bus, such as the bus 54 in Figures 4 and 6, is provided by a printed strip 100 which is connected to the metallized portions of the reverse side of the sheet or panel 93. Eyelets 101a, 101b and 101c are also provided for connection to the emitters as well as to the output leads of the semi-conductor device.

By printing all of the associated circuitry on a single sheet as described, a counter circuit may be built in which only a single semi-conductor device and a relatively simple printed circuit panel are required. Thus, in accordance with the teachings of this invention, reliable and stable frequency divider and counter circuits may be constructed with a circuit structure which combines the advantages of extreme simplicity and small size.

What is claimed is:

1. In a counter circuit, the combination comprising, a semi-conductor device including an elongated semi-conductive body having a longitudinal axis, a pair of base electrodes oppositely disposed and extending longitudinally in contact with said body, and a plurality of emitter electrodes arranged in spaced relation along a longitudinal line of said body; means for applying biasing potentials between said base electrodes and to said emitter electrodes for biasing said emitter electrodes in a non-conducting reverse direction; and means for applying signal energy to said emitter electrodes for rendering said emitter electrodes successively conductive.

2. In a counter circuit, the combination comprising, a semi-conductor device including an elongated semi-conductive body having a longitudinal axis, a pair of oppositely disposed base electrodes extending longitudinally in ohmic contact with said body, and a plurality of junction emitter electrodes arranged along a line which makes an acute angle with said longitudinal axis; means for applying biasing potentials between said base electrodes; means for biasing said emitter electrodes in a non-conducting reverse direction; and means for applying voltage pulses to said emitter electrodes for rendering said emitter electrodes successively conductive.

3. In a counter circuit, the combination comprising, a semi-conductor device including an elongated semi-conductive body having a longitudinal axis and oppositely disposed faces extending longitudinally along said body, a pair of base electrodes extending longitudinally and each in contact with a different one of said oppositely disposed faces, and a plurality of emitter electrodes cooperatively associated with said body in a line oblique to said longitudinal axis and equal in number to the scale of said counter plus one; means for applying biasing potentials between said base electrodes and to said emitter electrodes for normally biasing said emitter electrodes in the non-conducting reverse direction; and means for applying voltage pulses to said emitter electrodes in parallel for effecting successive conduction thereof.

4. In a counter circuit, the combination comprising, a semi-conductor device including an elongated semi-conductive body, a pair of oppositely disposed base electrodes extended along the length of said body and in contact therewith, and a plurality of emitter electrodes cooperatively associated with said body in a slanting row along said length and equal in number to the scale of said counter plus one; means for applying biasing potentials between said base electrodes and to said emitter electrodes for normally biasing said emitter electrodes in the non-conducting reverse direction; means for applying voltage pulses to said emitter electrodes for rendering said emitter electrodes successively conductive; and a signal amplifying device operatively connected between the last one of said row of emitter electrodes and the first one of said row of emitter electrodes for rendering said first emitter electrode conductive when said last emitter electrode is conductive.

5. In a counter circuit, the combination comprising, a semi-conductor device including an elongated semi-conductive body of one conductivity type, a pair of oppositely disposed base electrodes extending along the length of said body and in contact therewith, and a plurality of emitter electrodes cooperatively associated with said body along a path inclined to said base electrodes and equal in number to the sacle of said counter plus one; means for applying biasing potentials between said base electrodes and to said emitter electrodes in the non-conducting reverse direction; means for applying voltage pulses to said emitter electrodes for successively rendering said emitter electrodes successively conductive; a transistor of an opposite conductivity type and including a base, an emitter and a collector electrode, means coupling the base electrode of said transistor with the last one of said row of emitter electrodes; and means coupling said collector electrode with the first one of said row of emitter electrodes for rendering said first emitter electrode conductive when said last emitter electrode is conductive.

6. A semi-conductor device comprising a wafer of semi-conductive material having sides, a pair of base electrodes each in ohmic contact along the length of a different oppositely disposed side of said material, a plurality of junction emitter electrodes arranged along a row which is inclined to the latter mentioned sides, means for applying a biasing potential between said base electrodes, and means for applying a different biasing potential to each of said emitter electrodes.

7. In a counter circuit, the combination comprising, a semi-conductor device including a semi-conductive body having a length and having opposite faces along the said length, a pair of base electrodes each in contact with said body at a different one of said opposite faces, and a plurality of emitter electrodes cooperatively associated with said body in a slanting row along said length between said faces; means for applying biasing potentials between said base electrodes; means including a plurality of voltage dividers connected with said emitter electrodes for biasing said emitter electrodes in the non-conducting reverse direction; and means including a common bus for applying voltage pulses to said emitter electrodes for biasing said emitter electrodes successively in the conducting forward direction.

8. In a counter circuit, the combination comprising, a semi-conductor device including a semi-conductive body of one conductivity type said body having a length and having oppositely disposed faces, a pair of base electrodes each in contact with a different one of said oppositely disposed faces, and a plurality of emitter electrodes arranged in spaced relation along said length of said body, means for applying biasing potentials between said base electrodes and to said emitter electrodes; means for applying pulses to said emitter electrodes for rendering said emitter electrodes successively conductive; a transistor of an opposite conductivity type and including at least a pair of electrodes; means coupling one of said pair of electrodes of said transistor with the last of said plurality of emitter electrodes; and means coupling the other of said pair of electrodes of said transistor with the first of said plurality of emitter electrodes for rendering said first emitter electrode conductive when said last emitter electrode is conductive.

9. A semi-conductor device comprising a wafer of semiconductive material defined by sides and having a length, a pair of base electrodes extending along the length of said material and each in contact with a different opposite side thereof, means for applying biasing potentials between said base electrodes to provide a potential distribution across said semi-conductive material, a plurality of emitter electrodes arranged on said material in spaced relation along said length, and means including the potential distribution across said material providing coupling between said emitter electrodes to provide progressive conduction thereof and counting operation for said device.

10. In a counter circuit, the combination comprising, a semi-conductor device including an elongated semi-conductive body of one conductivity type, said body having a length and having opposite faces along the said length, a pair of base electrodes each in ohmic contact with a different one of said opposite faces, and a plurality of junction emitter electrodes cooperatively associated with said body and spaced in a row inclined to said base electrodes, said emitter electrodes being equal in number to the scale of said counter plus one; means for applying biasing potentials between said base electrodes; means including a plurality of voltage divider networks equal in number to said emitter electrodes for applying biasing potentials of descending amplitude to said emitter electrodes and for biasing each of said emitter electrodes in the reverse non-conducting direction; means including a common bus for applying voltage pulses to said emitter electrodes for rendering said emitter electrodes successively conductive; a transistor of an opposite conductivity type and including a base, an emitter and a collector electrode; means connecting the emitter electrode of said transistor to said common bus; means coupling the base electrode of said transistor with the last of said plurality of emitter electrodes; and means coupling said collector electrode with the first of said plurality of emitter electrodes for rendering said first emitter electrode conductive when said last emitter electrode is conductive.

11. In a counter circuit, the combination comprising, a semi-conductor device including a semi-conductive wafer having a length and having opposite faces along said length, a pair of base electrodes each in contact with a different one of said opposite faces, and a plurality of emitter electrodes arranged in a row along said length between said faces; means for applying biasing potentials between said base electrodes; means for biasing said emitter electrodes in a non-conducting reverse direction; means for applying voltage pulses to said emitter electrodes for rendering said emitter electrodes successively conductive; and output circuit means coupled with each of said emitter electrodes.

References Cited in the file of this patent

UNITED STATES PATENTS

| | | |
|---|---|---|
| 2,600,500 | Haynes et al. | June 17, 1952 |
| 2,665,607 | Reeves | Oct. 13, 1953 |
| 2,666,150 | Blakely | Jan. 12, 1954 |
| 2,702,838 | Haynes | Feb. 22, 1955 |
| 2,790,037 | Shockley | Apr. 23, 1957 |